(12) United States Patent
Landis et al.

(10) Patent No.: US 7,250,363 B2
(45) Date of Patent: Jul. 31, 2007

(54) ALIGNED DUMMY METAL FILL AND HOLE SHAPES

(75) Inventors: Howard S. Landis, Underhill, VT (US); Jeanne-Tania Sucharitaves, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 10/908,357

(22) Filed: May 9, 2005

(65) Prior Publication Data
US 2006/0252263 A1     Nov. 9, 2006

(51) Int. Cl.
*H01L 21/4763* (2006.01)
*H01L 23/552* (2006.01)

(52) U.S. Cl. ............... 438/622; 438/666; 257/659
(58) Field of Classification Search ............ 438/622, 438/624, 637, 638, 666, 668; 257/659, 758, 257/774, 779, 786
See application file for complete search history.

(56) References Cited

U.S. PATENT DOCUMENTS

| | | | |
|---|---|---|---|
| 6,217,721 B1 | 4/2001 | Xu et al. | |
| 6,236,115 B1 | 5/2001 | Gaynes et al. | |
| 6,399,486 B1 | 6/2002 | Chen et al. | |
| 6,589,594 B1 | 7/2003 | Hembree | |
| 6,638,858 B2 | 10/2003 | Cheng | |
| 2003/0124846 A1 | 7/2003 | Chiang et al. | |

*Primary Examiner*—Kevin M. Picardat
(74) *Attorney, Agent, or Firm*—William D. Sebo; Greenblum & Bernstein, P.L.C.

(57) ABSTRACT

Aligning metal fill shapes with corresponding holes of a metal shield is provided. The holes of the metal shield are laid out corresponding to a pre-selected grid referenced to a pre-selected origin. The metal fill shapes of the metal fill pattern, are arranged in accordance with the same pre-selected grid and referenced to the same pre-selected origin. Accordingly, regardless of the size or spacing of the metal fill holes, a metal fill shape will substantially align with a corresponding metal fill hole. Such alignment between metallization levels and the structure of the metal shield and metal fill shape pattern enhance the electric noise blocking properties of the metal shield in conjunction with the metal fill shape.

20 Claims, 4 Drawing Sheets

ALIGNED DUMMY METAL FILL AND HOLE SHAPES

DESCRIPTION

1. Field of the Invention

The invention relates to electrical shielding, and more particularly to electrical shielding for integrated circuits and a method thereof.

2. Background Description

In integrated circuit (IC) circuit design, large expanses of metal areas may be necessary in certain areas of the circuit. Such large metal sheets or shields are frequently a fraction of a micron thick and tens of microns wide and long, resulting in a thin sheet of metal being fabricated in that particular area. Such large metal areas are frequently used to shield electronic noise produced by a nearby portion of the circuit.

Such large areas of metal are frequently fabricated using a damascene process such as, a copper damascene process. Additionally, the large metal areas are frequently designed to have holes in them so that the large area of metal is not continuous, but rather interrupted by isolated islands of substrate material which is level with the top of the metal. These isolated islands of dielectric are referred to as holes and are typically incorporated into the circuit design as an aid in the fabrication process, such as, for example, maintaining a uniform thickness of the metal. For example, in a copper damascene fabrication process, the holes allow the substrate contained therein to act as polish stops during the polishing step and help promote a uniform metal thickness. Accordingly, a large metal area or sheet may have multiple holes arranged throughout its area.

When a large metal area having holes is included in a particular layer, it is common for at least one of the adjacent layers, either above or below the metal sheet to include a pattern of metal fill. The metal fill includes metal fill shapes which are typically approximately the size of the holes on the adjoining layer.

Typical design processes include orienting the holes in the metal sheet relative to the borders of the metal sheet and relative to the area occupied by the metal sheet. Furthermore, typical design processes for the metal fill includes orienting the metal fill relative to the border and surrounding area of the metal fill area. Typically, each metal sheet and the metal fill is optimized for its own corresponding level and local environment. Accordingly, there is typically little design consideration given to the relationship between the holes pattern, spacing, and density as related to the pattern, spacing and density of the adjoining metal fill.

SUMMARY OF THE INVENTION

In a first aspect of the invention, a method of electrical shielding includes arranging an electrical shield on a first layer of an integrated circuit, and arranging a pattern of holes in the electrical shield, wherein the pattern of holes is positioned a prescribed distance from a reference point. The method also includes arranging a corresponding pattern of metal fill shapes on a second layer of the integrated circuit, wherein the pattern of metal fill shapes is positioned the prescribed distance from the reference point.

In another aspect of the invention, a method of forming a metal shield structure in an integrated circuit includes defining a hole grid having hole centers defining locations for holes on the hole grid, and defining a fill grid having fill centers defining a location for fills on the fill grid. The method also includes positioning the hole grid on a first level relative to a reference point, and positioning the fill grid on a second level relative to the reference point such that at least one fill center substantially aligns with a corresponding hole center.

In another aspect of the invention, an apparatus for shielding an integrated circuit includes a metal shield on a first level having holes arranged in a pattern, wherein centers of the holes on the pattern define a grid referenced to a reference point. The apparatus also includes metal fill shapes on a second layer arranged in a pattern, wherein centers of the metal fill shapes define a grid referenced to the reference point, and at least one center of a metal fill shape substantially aligns with a center of a corresponding hole.

DETAILED DESCRIPTION OF EMBODIMENTS OF THE INVENTION

Embodiments of the invention are directed to aligning a metal fill of a metal shield on a layer with corresponding holes in a metal shield of another layer, regardless of the chosen pattern, density and pitch of the holes in the metal shield. The alignment between the holes and the corresponding metal fill is achieved, for example, by using the same pattern for the metal fill as used for the corresponding holes, and referencing both patterns to the same point on the wafer. Thus, as the metal shield is specified to have a certain shape, pitch and density of holes as well as a pattern origin, the corresponding metal fill will also have the same geometric specifications assuring that each metal fill shape aligns with the corresponding hole. The alignment between metal fill and the holes of a metal shield provides improved RF shielding. Additionally, the alignment method simplifies the design process by allowing easy alignment between holes and corresponding metal fill regardless of location on a wafer.

Figure 2:
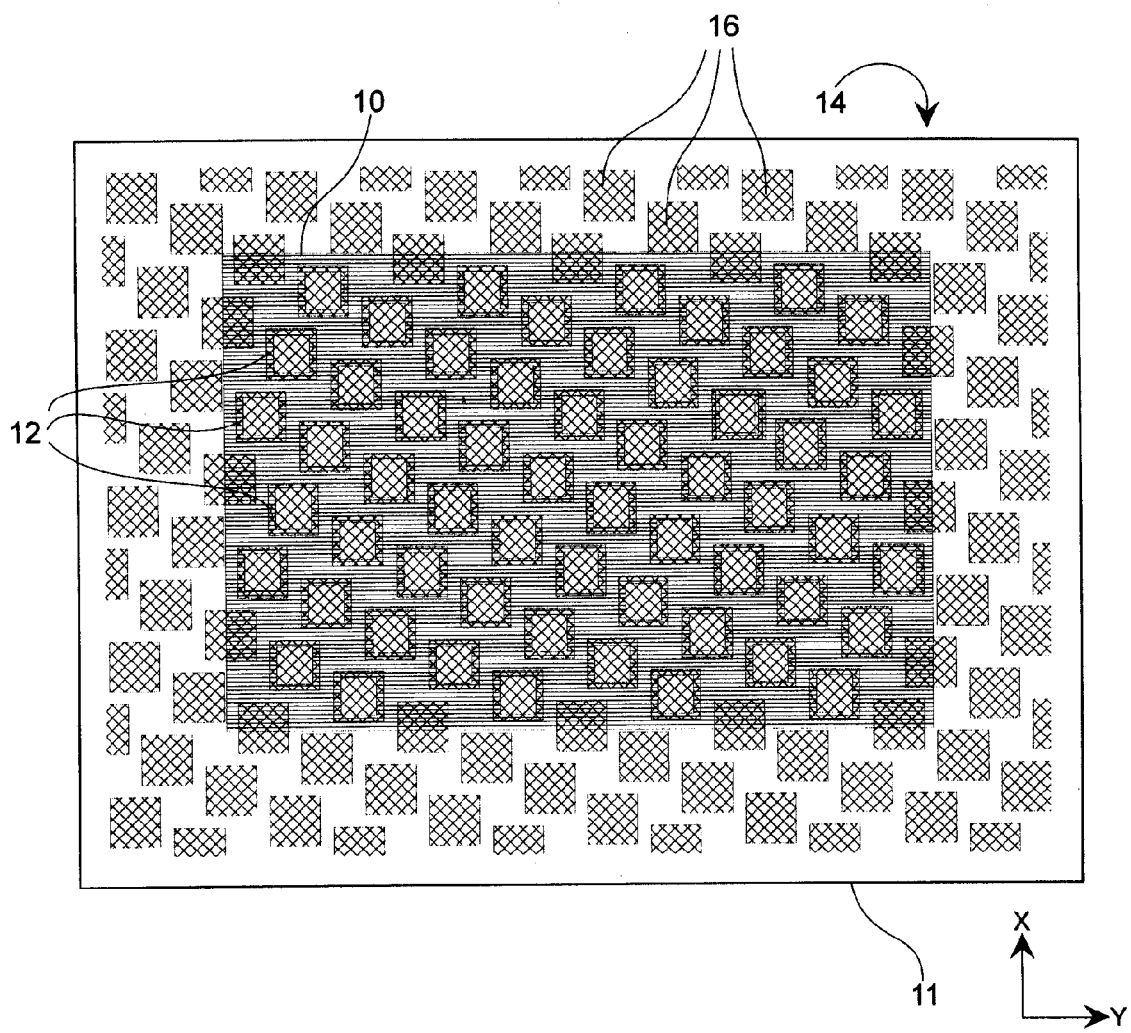
FIG. 2 is an illustration of an embodiment of metal fill shapes aligned to holes in accordance with the invention.
Figure 3:
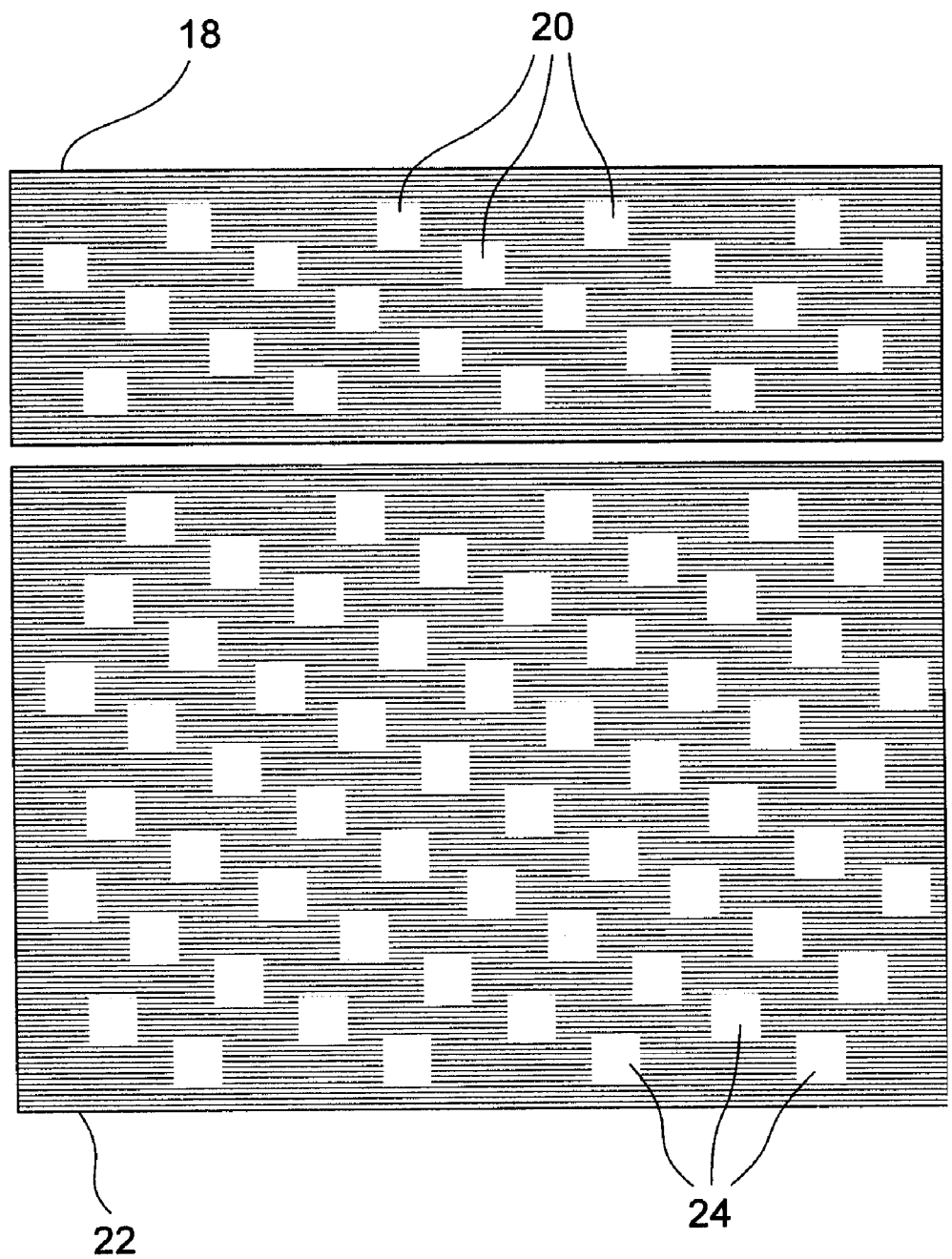
FIG. 3 is an illustration of a metal shield having different size holes.
Figure 4:
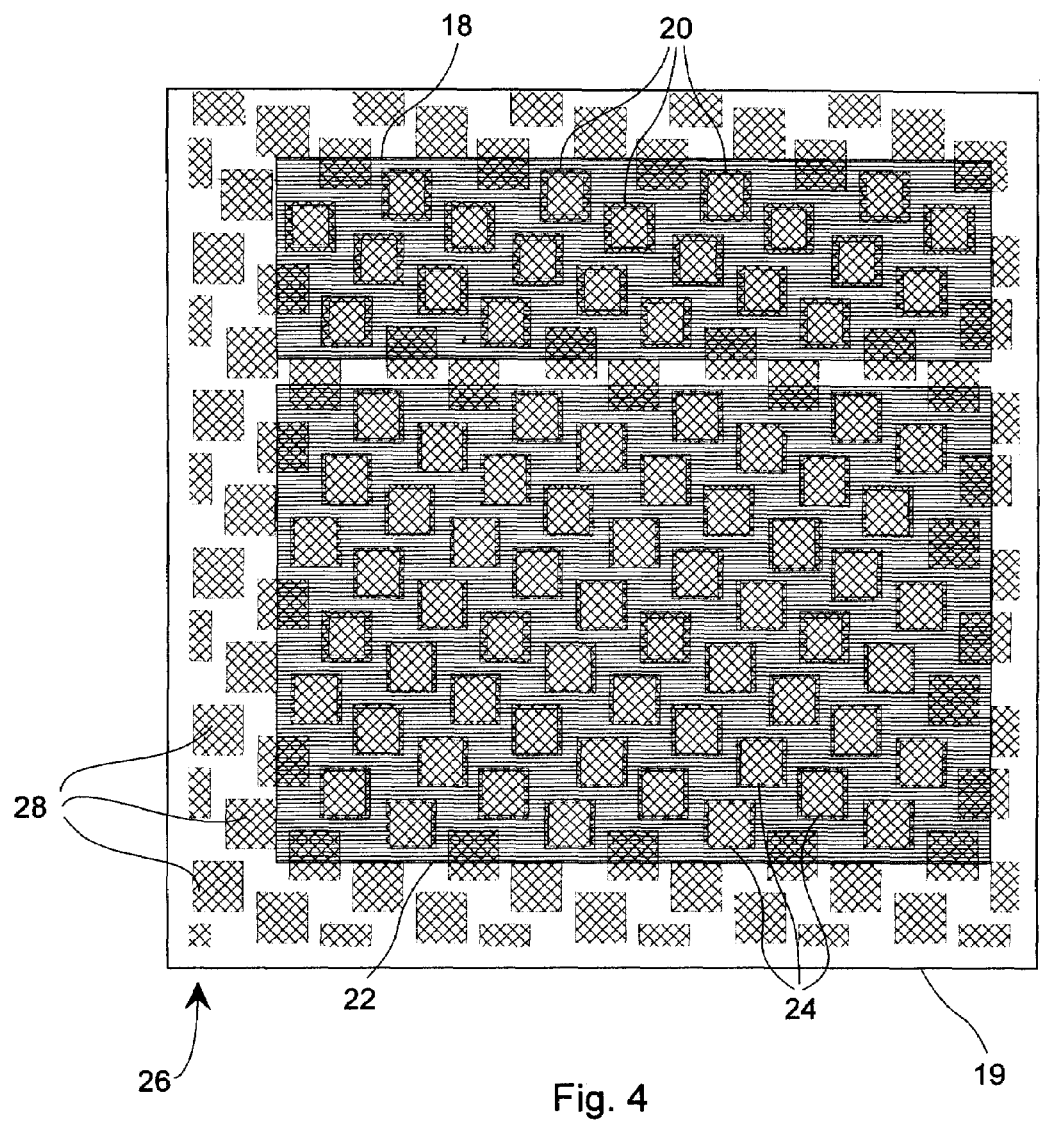
FIG. 4 is an illustration of an embodiment of metal fill shapes aligned with different sized holes in accordance with the invention.

FIGS. 1-4 represent respective metal shields, fill shapes and corresponding holes. However, in view of the below discussion it should be recognized that FIGS. 1-4 may equally represent a method of electrical shielding in an integrated circuit. By way of example, FIG. 3 may represent forming a metal shield having holes on a first level and FIG. 4 represents forming a metal fill having metal fill shapes on a second level. The method includes forming the metal fill shapes to align with and have a corresponding shape to the holes. The method further includes shielding a circuit by forming the holes and metal fill shapes in alignment with one another.

Figure 1:
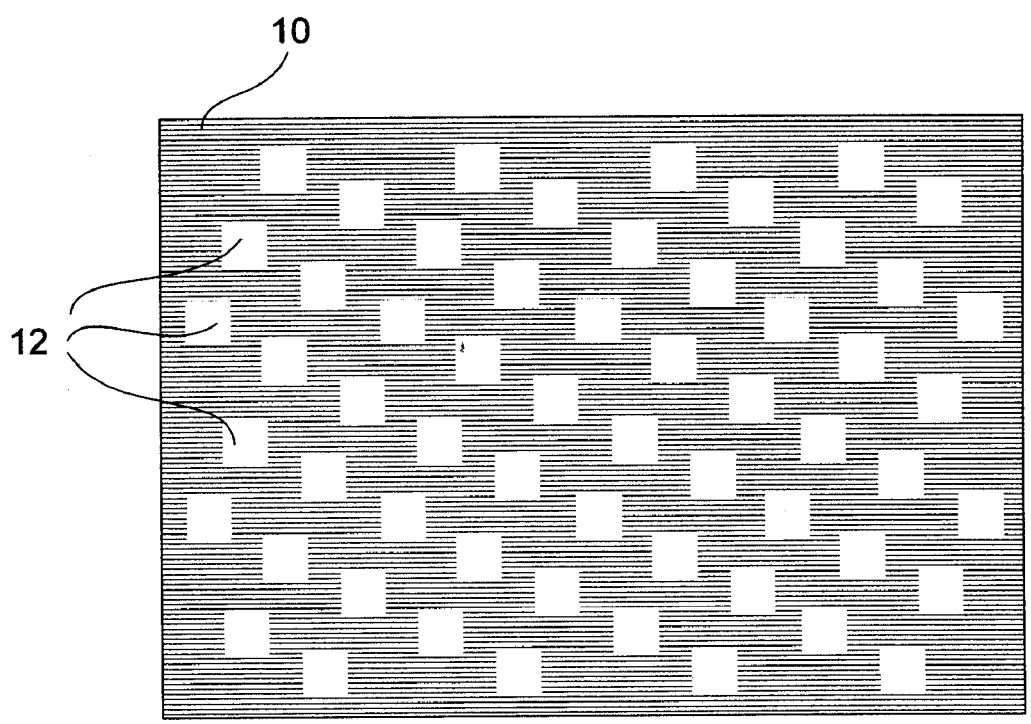
FIG. 1 is an illustration of a metal shield with holes.

Referring now to FIG. 1, a metal shield 10 is shown having holes 12 therein. The holes 12 in the metal shield 10 may aid in the fabrication of the metal shield, for example, functioning as polish stops during a polishing step. The metal shield 10 may be made from any conductor including copper. The metal shield 10 is typically a few tenths of microns in thickness, and tens or many tens of microns in length and width. Although the metal shield 10 is shown as a rectangle, any general shape of a metal shield may be used. Accordingly, the metal shield may be square, circular, triangular, elliptical, etc. The holes 12 in the metal shield 10 are typically a uniform pattern of repeating holes spaced across the metal shield 10. Although in this example, holes 12 are shown as squares, the holes may generally have any shape in addition to the square holes 12 shown, including rectangle, triangle, circle and ellipse.

Generally, the holes 12 may range from a width of a tenth of a micron to many tenths of a micron, and even larger. Typically, the size of the holes 12 is a multiple of the minimum width achievable in the prescribed fabrication process. Thus, for example, where the minimum width achievable in the fabrication process is 0.14 microns (μm), a typical hole size in a metal shield will be about three times that size, i.e. 0.42 μm. Generally, the holes 12 are dimensioned to be as small as easily achievable in the fabrication process.

The placement of the holes, or "hole pattern" includes indicating a size of the hole 12, the location of one hole 12 as referenced by an origin on the wafer, and the hole pattern, and hole density. Thus, the hole pattern can include virtually any desired spacing and orientation and is laid out with reference to an easily identifiable point on the wafer.

Referring to FIG. 2, the metal shield 10 including the holes 12 is shown with a corresponding metal fill pattern 14 overlaid thereupon. The metal fill pattern 14 includes individual metal fill shapes 16. As can be seen, some of the metal fill shapes 16 align with a corresponding hole 12. Accordingly, the center of each metal fill shape 16 substantially corresponds to the center of each corresponding hole 12. Additionally, each shape 16 may be created to be slightly larger than the corresponding hole 12. As such, there may be overlap between each metal fill shape 16 and a portion of the metal shield 10 surrounding the corresponding hole 12. The metal shield 10 may be placed on a layer over an integrated circuit with a perimeter defining, for example, a square 11.

The metal fill pattern 14 generally has the same pattern, distribution, and pitch as the holes 12. Additionally, each metal fill shape 16 generally has the same shape as the corresponding hole 12. The metal fill pattern 14 also is referenced to the same origin as the holes 12. Accordingly, the metal fill shapes 16 will align with each corresponding holes 12.

The metal fill shapes 16 are on the same center as the corresponding hole 14 and have the same shape. Additionally, the dimensions of the metal fill shapes 16 are typically about 50% larger in the x and y directions as the corresponding hole 14. Thus, a metal fill shape 16 is typically about 4.5 times the size of the minimum feature which may be fabricated by the particular fabrication process. This typically is the minimum line width and minimum space between wires achievable by the process.

The pattern of the holes 12 and metal fill shapes 16 are each placed on a single grid referenced to the same point such as the center or lower left region of the chip or wafer, for example, and thus are forced to coincide with one another, regardless of which level each may be formed on. The holes 12 and metal fill shapes 14 may be placed by specifying the location of the first shape, and specifying the periodicity, i.e., pitch of the pattern, for example. Accordingly, as long as the holes 12 and metal fill shapes 16 have the same origin and the same periodicity, each will line up with the other.

Typically the metal fill shapes 16 are applied using the same process as forming the metal shield 10. For example, the metal fill shapes 16 may be made of copper and formed by a copper damascene process. Thus, the metal fill shapes 16 may be formed by etching a trench in a substrate where the trench has the final desired shape of the metal fill shapes 16. Copper is then deposited in the trench and on the surrounding top surface of the substrate. After deposition, the copper is removed with a polishing process such as, for example, chemical mechanical polishing ("CMP"). The resulting metal fill shape 16 will then be flush with the surrounding top surface of the supporting substrate and have the shape of the original trench.

Referring to FIG. 3, a first metal shield 18 and a second metal shield 22 are illustrated. The first metal shield 18 has first holes 20 therein. The second metal shield 22 has second holes 24 therein. The first holes 20 are smaller than the second holes 24. It should be noted that, even though the two sets of holes are of different sizes, the centers for the first holes 20 and the centers for the second holes 22 are arranged on the same grid, both oriented to the same origin. Furthermore, the centers of the first holes 20 and the second holes 24 have the same pitch and spacing as one another.

Due to the overlap between the metal shield and the corresponding hole around the perimeter of the hole, some mis-alignment between the hole pattern and the metal fill pattern may be tolerated. Additionally, the overlap reduces electronic leakage from passing through the metal shield and metal fill shape structure. A wide range of overlap may be utilized between the two layers, and the overlap may, or may not, occur along all edges of the hole and metal fill shape combination. Additionally, such overlap is not a required feature. Thus, the metal fill shape pattern which does not provide overlap may be preferable under certain circumstances and is easily accommodated by embodiments of the invention.

Referring to FIG. 4, the first metal shield 18 and the second metal shield 22 of FIG. 3 are illustrated being overlaid with a metal fill pattern 26. The metal fill pattern 26 includes metal fill shapes 28. In this embodiment of the invention, the metal fill shapes 28 are of a uniform size. The metal fill shapes 28 are a uniform size because the size of the metal fill shapes 28 are sufficient to cover both the first holes 20 and the second holes 24. Accordingly, the metal fill shapes 28 covering the first holes 20 has a larger overlap with the first metal shield 18 along the edges of the metal fill shapes 28. The metal fill shapes 28 covering the second holes 24 of the second metal shield 22 has a relatively smaller overlap with the second metal shield 22 around the perimeter of the second holes 24. The metal shields 18 and 22 may be placed on a layer over an integrated circuit, with a perimeter defining, for example, a square 19.

As can be seen, the metal fill shapes 28 of the metal fill pattern 26 are arranged on a grid where the metal fill shapes 28 have centers which correspond to the centers of both the first holes 20 and the second holes 24. Additionally, the pattern of the first holes 20 and the second holes 24 are on the same grid. Thus, the single pattern of the metal fill shapes 28 of the metal fill pattern 26 corresponds to the pattern of both first and second holes 20 and 24, of the metal shields 18 and 22, respectively.

Although a portion of the metal fill shapes 28 which correspond to the region between the first metal shield 18 and the second metal shield 22 does not correspond to holes of either metal shield, 18 and 22, metal fill shapes occupy that region nonetheless. The metal fill shapes 28 are passive components, and the lack of correspondence hole and metal fill between the first and second metal shield 18 and 22 has substantially no effect on the functionality of the metal fill pattern 26.

The first holes 20, the second holes 24, and the metal fill shapes 28 are designed to each have their centers positioned on a grid having the same spacing and density, as well as each being referenced to the same reference point. Thus, regardless of whether a particular hole is located on the first metal shield 18 or the second metal shield 22, the particular hole will align with a corresponding metal fill shape 28 of the metal fill pattern 26. Additionally, because the first and second fill holes, 20 and 24, are arranged on the same grid, the first and second holes 20 and 24 will align with a corresponding metal fill shape 28 regardless of the size of the particular hole.

While the invention has been described in terms of exemplary embodiments, those skilled in the art will recognize that the invention can be practiced with modifications and in the spirit and scope of the appended claims.

What is claimed is:

1. A method of electrical shielding, comprising the steps of:
    arranging an electrical shield on a first layer of an integrated circuit;
    arranging a pattern of holes in the electrical shield, wherein the pattern of holes is positioned a prescribed distance from a reference point; and
    arranging a corresponding pattern of metal fill shapes on a second layer of the integrated circuit, wherein the pattern of metal fill shapes is positioned the prescribed distance from the reference point.

2. The method of claim 1, wherein the pattern of holes and the corresponding pattern of metal fill shapes are arranged so that a center of at least one hole of the pattern of holes substantially aligns with a center of at least one metal fill shape of the pattern of metal fill shapes.

3. The method of claim 1, wherein the pattern of holes defines a grid of hole centers and the corresponding pattern of metal fill shapes defines a grid of fill shape centers, wherein the spacing of centers of the grid of hole centers is substantially equal to the spacing of centers of the grid of fill shape centers.

4. The method of claim 1, further comprising forming a shape defined by a perimeter of a hole of the pattern of holes as substantially a shape defined by a perimeter of a metal fill shape of the pattern at metal fill shapes.

5. The method of claim 4, further comprising arranging the metal fill shape to partially overlap a region of the electrical shield proximate to an edge of a corresponding hole of the pattern of holes.

6. The method of claim 4, further comprising arranging a width of a first hole of the pattern of holes to be smaller than a width of a corresponding metal fill shape of the pattern of metal fill shapes.

7. The method of claim 6, further comprising arranging a width of the first hole to be about 50% smaller than a width of the corresponding metal fill shape.

8. The method of claim 6, further comprising arranging a width of a second hole of the pattern of holes to be different than the width of the first hole, wherein a metal fill shape corresponding to the second hole partially overlaps a region of the electrical shield proximate to an edge of the second hole.

9. The method of claim 1, further comprising forming a polish stop within at least one hole of the pattern of holes.

10. A method of forming a metal shield structure in an integrated circuit, comprising the steps of:
    defining a hole grid having hole centers defining locations for holes on the hole grid;
    defining a fill grid having fill centers defining a location for fills on the fill grid;
    positioning the hole grid on a first level relative to a reference point; and
    positioning the fill grid on a second level relative to the reference point such that at least one fill center substantially aligns with a corresponding hole center of the hole centers.

11. The method of claim 10, wherein aligning the at least one fill center with a corresponding hole center also aligns multiple fill centers of at least one hole center with corresponding multiple hole centers.

12. The method of claim 10, further comprising forming a metal shield and arranging the hole grid on the metal shield to define hole positions in the metal shield.

13. The method of claim 10, wherein: defining a hole grid comprises forming a hole in a metal shield at each hole center of the hole centers, and defining a fill grid comprises forming a metal fill at each fill center of the fill centers in another layer.

14. The method of claim 13, further comprising forming at least one metal fill to overlap edges of the metal shield proximate to a corresponding hole.

15. The method of claim 11, further comprising forming a width of the at least one metal fill to be about 50% wider than a width of the corresponding hole.

16. An apparatus for shielding an integrated circuit, comprising:
    a metal shield on a first level having holes arranged in a pattern, wherein centers of the holes define a grid referenced to a reference point; and
    metal fill shapes on a second layer arranged in a pattern, wherein centers of the metal fill shapes define a grid referenced to the reference point and at least one center of a metal fill shapes of the metal fill shapes substantially aligns with a center of a corresponding hole of the holes.

17. The apparatus of claim 16, wherein holes in the metal shield substantially align with corresponding metal fill shapes.

18. The apparatus of claim 16, further comprising at least one metal fill shape configured to overlap a portion of the metal shield proximate to a corresponding hole of the metal shield.

19. The apparatus of claim 18, wherein at least one metal fill shape of the metal fill shapes has a width about 50% larger than a width of a corresponding hole of the holes.

20. The apparatus of claim 16, wherein a perimeter of at least one hole defines at least one of any of a square, rectangle, circle, ellipse, and triangle.

* * * * *